(12) United States Patent
Bobde et al.

(10) Patent No.: US 9,685,523 B2
(45) Date of Patent: Jun. 20, 2017

(54) DIODE STRUCTURES WITH CONTROLLED INJECTION EFFICIENCY FOR FAST SWITCHING

(71) Applicants: Madhur Bobde, San Jose, CA (US); Harsh Naik, Troy, NY (US); Lingpeng Guan, Sunnyvale, CA (US); Anup Bhalla, Santa Clara, CA (US); Sik Lui, Sunnyvale, CA (US)

(72) Inventors: Madhur Bobde, San Jose, CA (US); Harsh Naik, Troy, NY (US); Lingpeng Guan, Sunnyvale, CA (US); Anup Bhalla, Santa Clara, CA (US); Sik Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/573,187

(22) Filed: Dec. 17, 2014

(65) Prior Publication Data
US 2016/0181391 A1    Jun. 23, 2016

(51) Int. Cl.
| *H01L 29/868* | (2006.01) |
| *H01L 29/66* | (2006.01) |
| *H01L 29/78* | (2006.01) |
| *H01L 29/06* | (2006.01) |
| *H01L 29/40* | (2006.01) |
| *H01L 29/739* | (2006.01) |

(52) U.S. Cl.
CPC ...... *H01L 29/6609* (2013.01); *H01L 29/0615* (2013.01); *H01L 29/0619* (2013.01); *H01L 29/0696* (2013.01); *H01L 29/402* (2013.01); *H01L 29/407* (2013.01); *H01L 29/66734* (2013.01); *H01L 29/7395* (2013.01); *H01L 29/7803* (2013.01); *H01L 29/7839* (2013.01); *H01L 29/868* (2013.01)

(58) Field of Classification Search
CPC ............ H01L 29/0619; H01L 29/0878; H01L 29/66712; H01L 29/0868
See application file for complete search history.

(56) References Cited

U.S. PATENT DOCUMENTS

| 5,689,128 | A | * | 11/1997 | Hshieh | ................ H01L 29/0878 257/329 |
| 6,228,719 | B1 | * | 5/2001 | Frisina | ............. H01L 29/66712 257/E21.418 |
| 7,427,800 | B2 | * | 9/2008 | Yilmaz | ............... H01L 29/0619 257/488 |
| 2008/0211020 | A1 | * | 9/2008 | Saito | ................... H01L 29/0634 257/342 |

(Continued)

*Primary Examiner* — Jerome Jackson, Jr.
*Assistant Examiner* — Fang-Xing Jiang
(74) *Attorney, Agent, or Firm* — Bo-In Lin

(57) ABSTRACT

This invention discloses a semiconductor device disposed in a semiconductor substrate. The semiconductor device includes a first semiconductor layer of a first conductivity type on a first major surface. The semiconductor device further includes a second semiconductor layer of a second conductivity type on a second major surface opposite the first major surface. The semiconductor device further includes an injection efficiency controlling buffer layer of a first conductivity type disposed immediately below the second semiconductor layer to control the injection efficiency of the second semiconductor layer.

8 Claims, 10 Drawing Sheets

(56) References Cited

U.S. PATENT DOCUMENTS

2010/0038675 A1* 2/2010 Yoshikawa ......... H01L 29/0634
257/142
2013/0126888 A1* 5/2013 Kizilyalli ............ H01L 21/2654
257/76

* cited by examiner

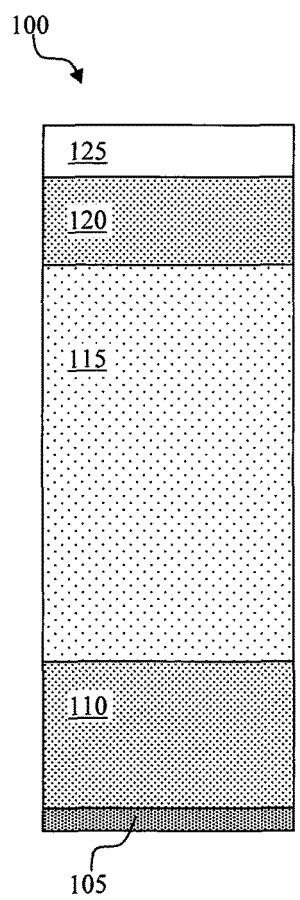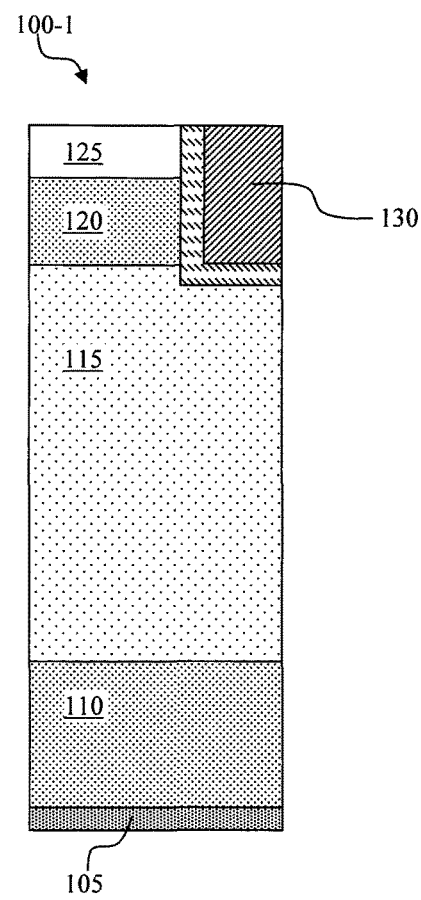
Fig. 2 Present Invention  Fig. 3 Present Invention

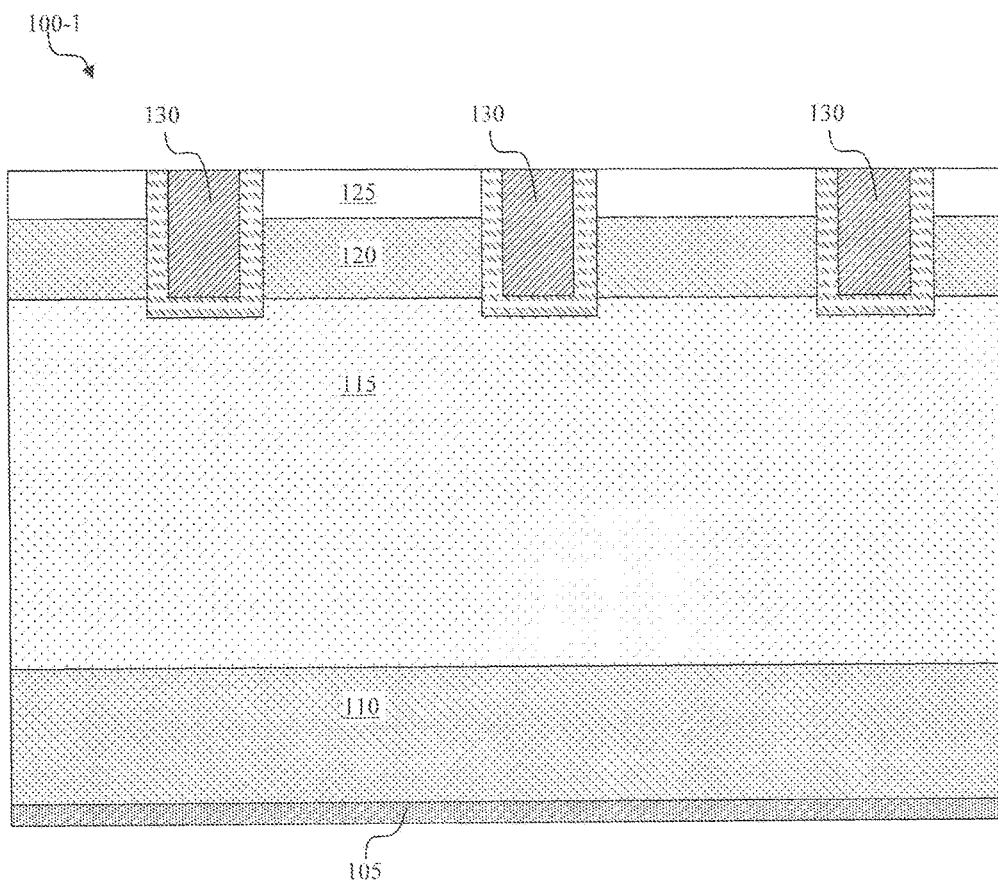
Fig. 3-1 Present Invention

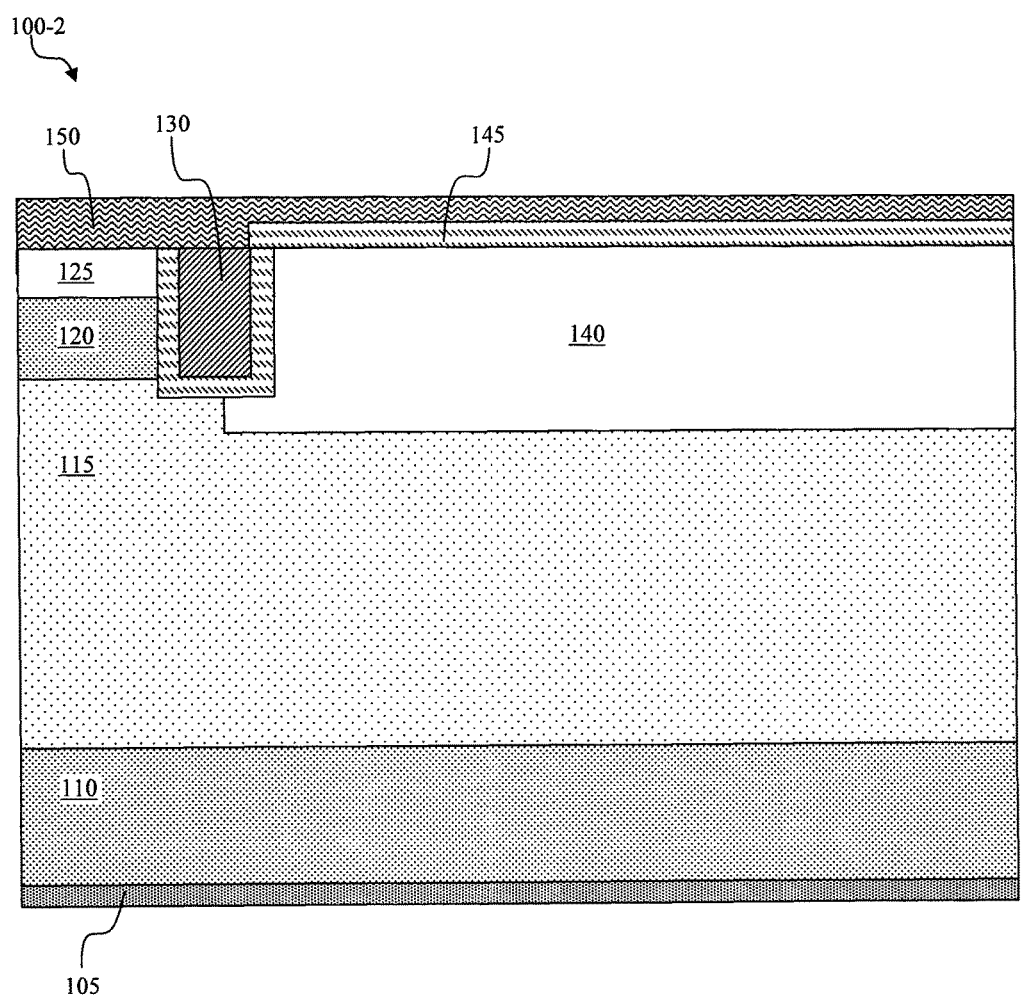
Fig. 4 Present Invention

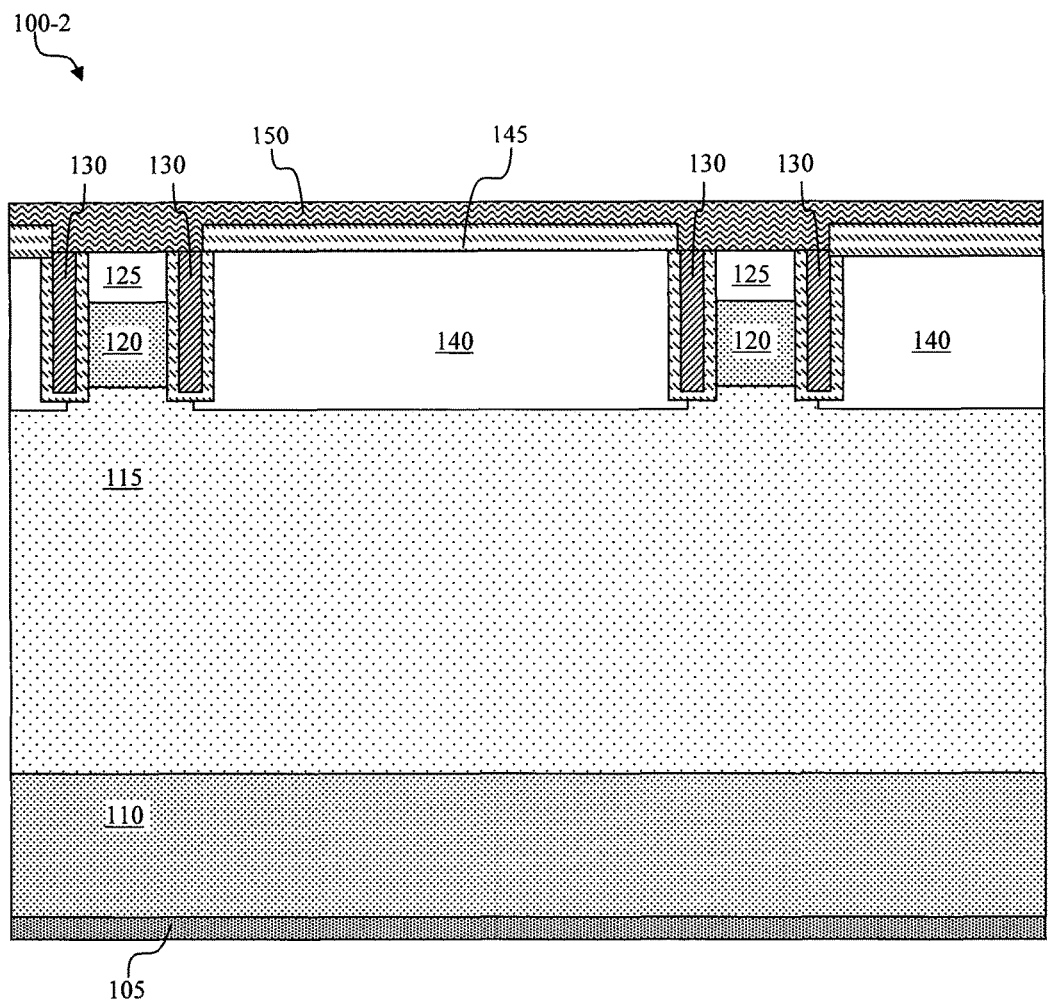
Fig. 4-1 Present Invention

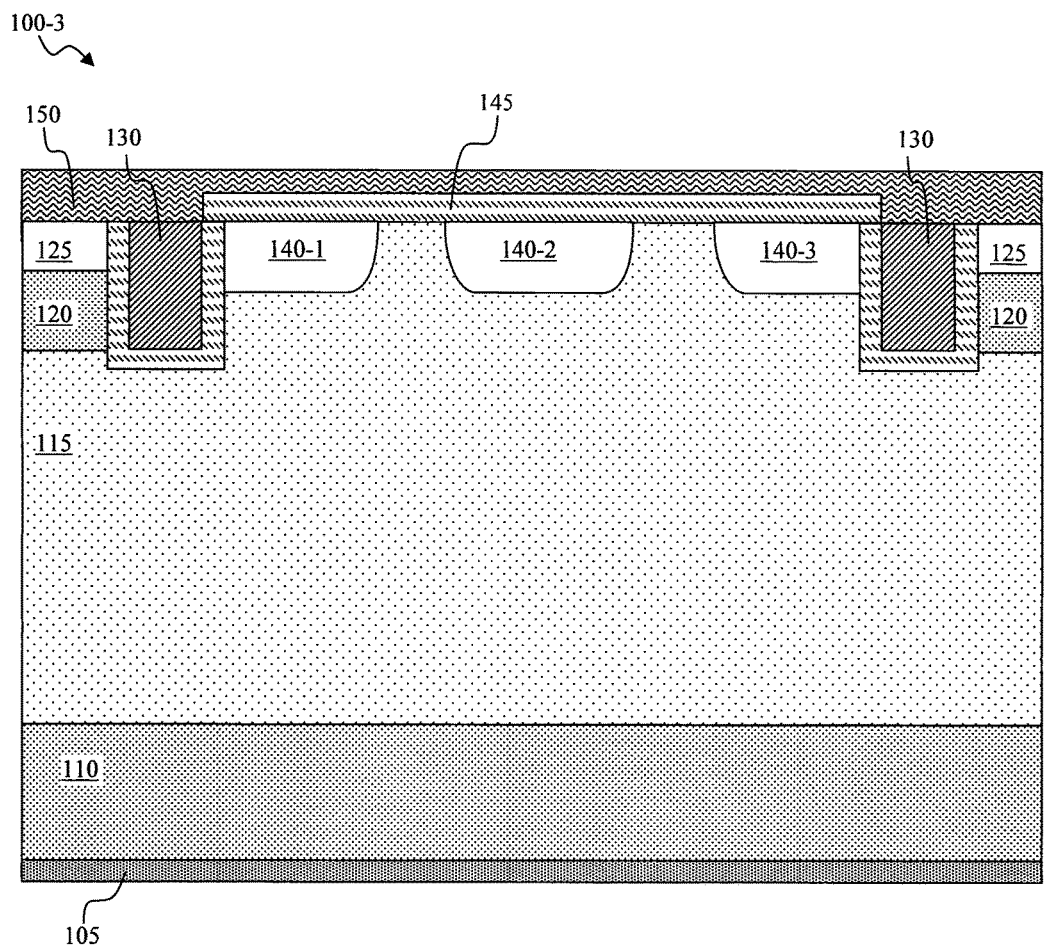
Fig. 5 Present Invention

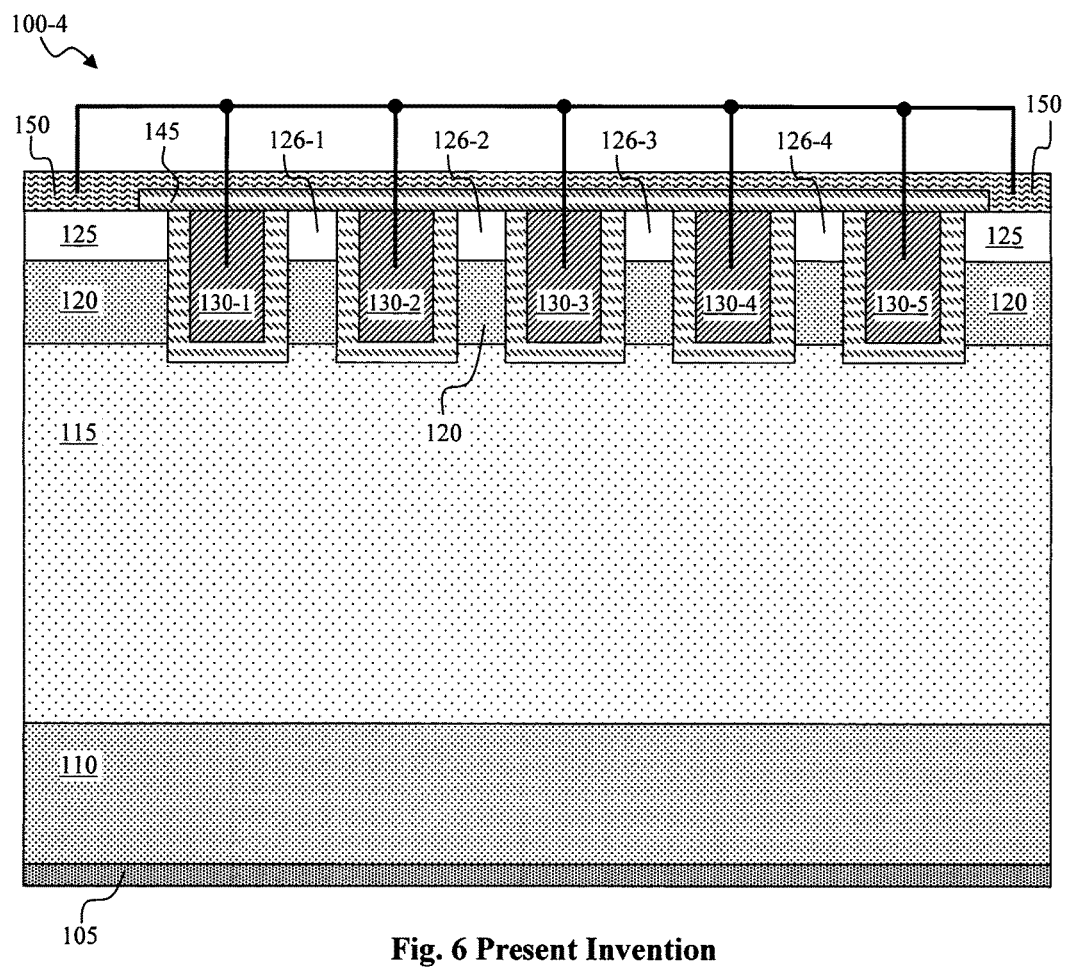
Fig. 6 Present Invention

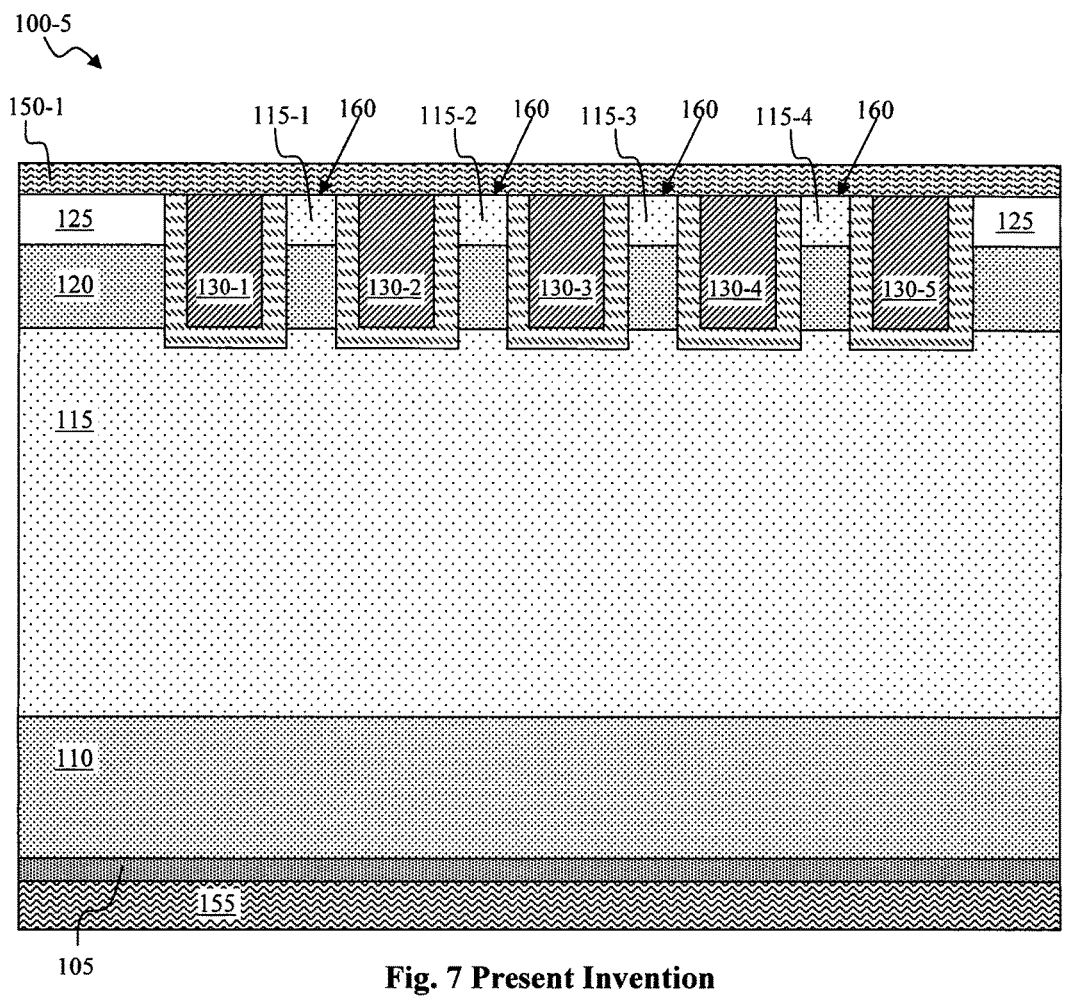
Fig. 7 Present Invention

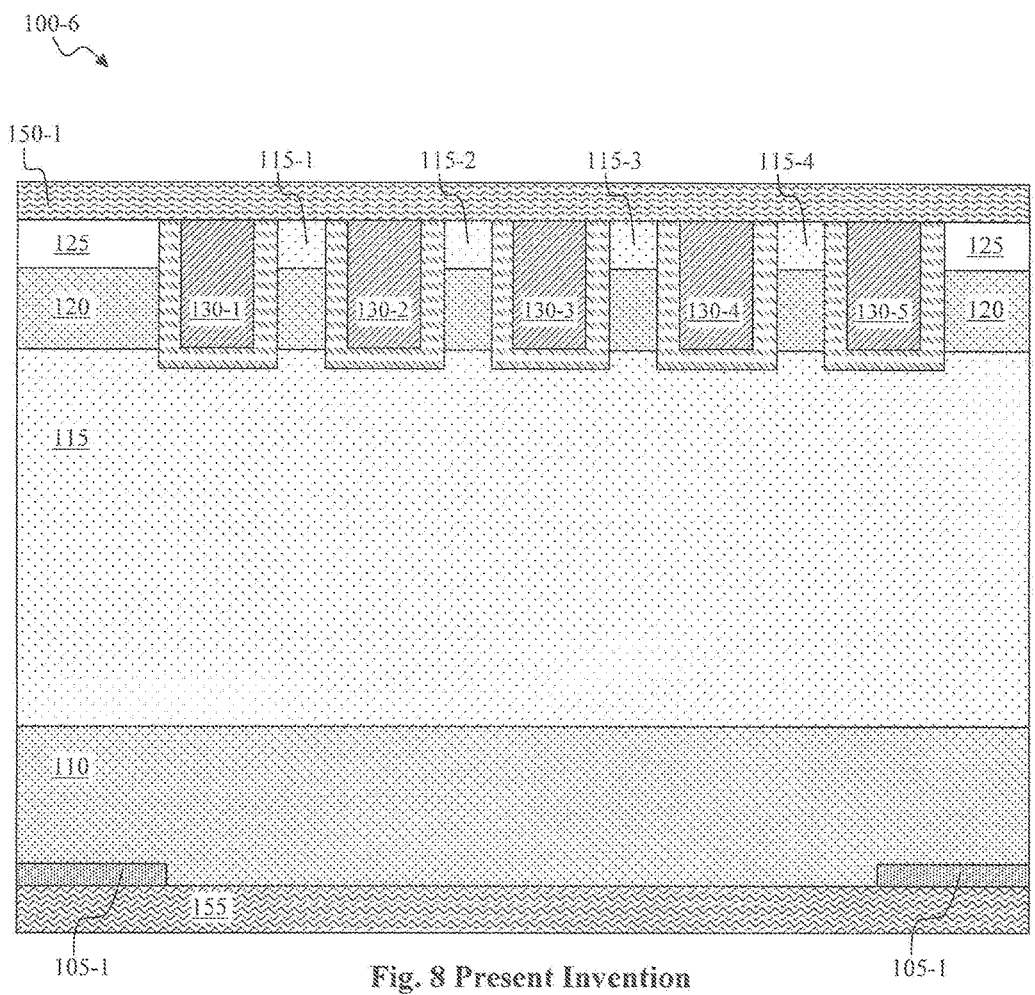
Fig. 8 Present Invention

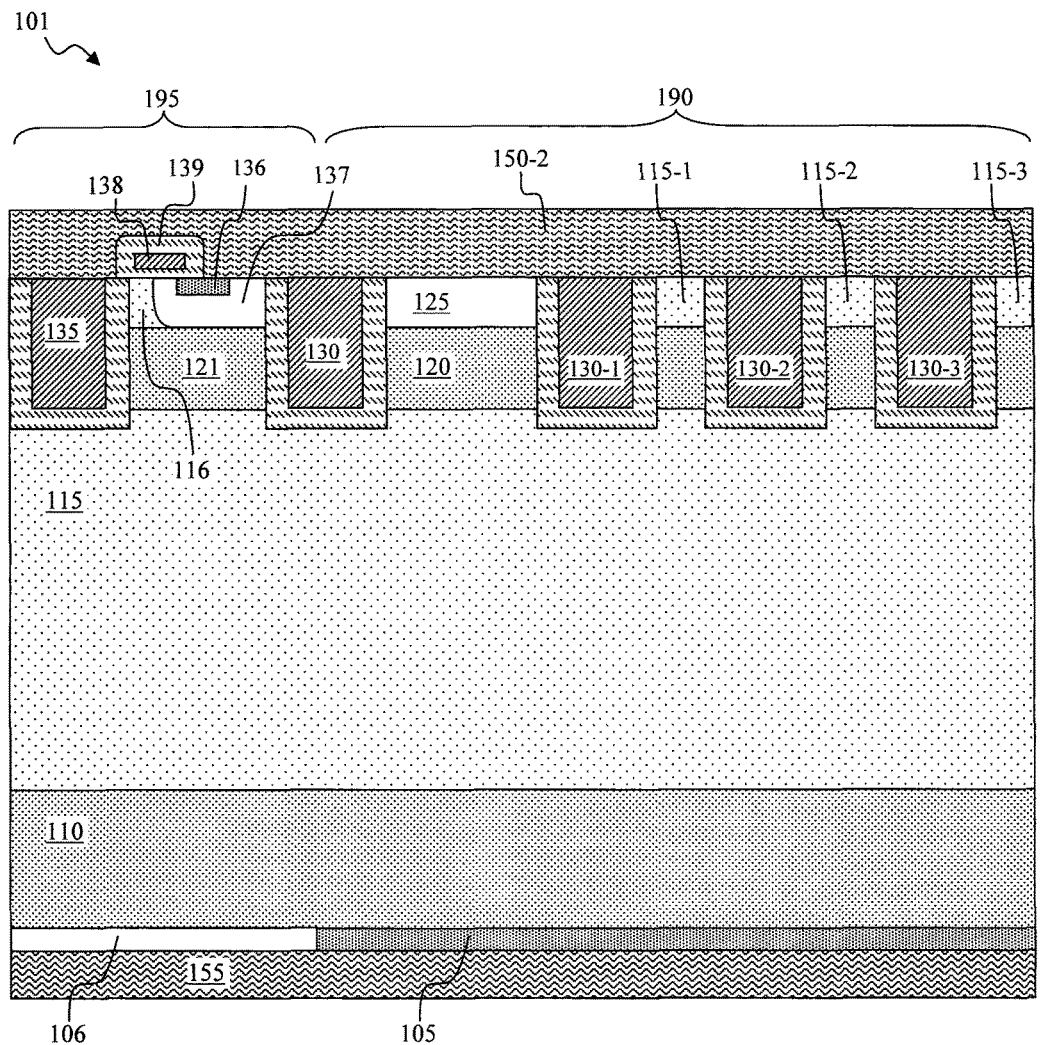
Fig. 9 Present Invention

DIODE STRUCTURES WITH CONTROLLED INJECTION EFFICIENCY FOR FAST SWITCHING This is a Divisional application of a previously filed co-pending application with Ser. No. 12/931,429 filed on Jan. 31, 2011 by identical common inventors of this application. The disclosures made in application Ser. No. 12/931,429 are hereby incorporated by reference in this patent application.

BACKGROUND OF THE INVENTION

1. Field of the Invention

The invention relates generally to the configurations and methods of manufacturing semiconductor power devices. More particularly, this invention relates to a device configuration and method of manufacturing a high voltage PiN (P-type/intrinsic/N-type) diode with low injection efficiency for improving the switching speed.

2. Description of the Prior Art

PiN diodes formed with conventional structures are still limited by a high modulation due to limited options for controlling the amount of anode and cathode electric charges injected as carriers into the intrinsic (or lowly doped) semiconductor layer typically disposed between the more heavily doped N-type and P-type layers. The difficulties cause the diode device to have a slow switching speed. Furthermore, the limited control of the charges also causes high reverse current and recovery time, which results in higher power consumptions and low operation efficiency.

A popular method of reducing the modulation is to employ carrier lifetime control techniques such as electron irradiation (ER), or gold and platinum diffusion to form deep level recombination sites. But these techniques require extra processing steps that add to the cost, and also cause increased leakage at high cathode biases. Furthermore, changes on the lifetime with temperature cause the diode reverse recovery to degrade significantly at high temperatures for lifetime controlled devices.

FIG. 1A is a cross sectional view of a conventional PiN diode (e.g. formed as a metal oxide semiconductor field effect transistor (MOSFET) body diode). The PiN diode includes an N buffer region 3 for soft recovery supported on a heavily doped N+ bottom substrate layer 4 nears the bottom surface. A lightly doped N-type (or intrinsic) layer 2 (e.g., an epitaxial layer) is formed on top of the N buffer layer 3 for blocking the voltage and a topside P layer 1 is formed (e.g., together with the implantation of a P-body region elsewhere on the die for a MOSFET) on top of the N-epitaxial layer 2. The lightly doped N-type layer 2 is the "intrinsic" portion of the PiN diode. By way of example, topside P-type layer 1 may have a doping concentration of about $1E17/cm^3$ and a thickness of about 2 μm, the N-type epitaxial layer 2 may have a doping concentration of $1E14/cm^3$ and a thickness of about 40 μm, the N-type buffer layer 3 may have a doping concentration of about $1E15/cm^3$ and a thickness of about 10 μm, and the N-type bottom substrate layer 4 may have a doping concentration of about $1E19/cm^3$, and a thickness of about 100 μm.

This high voltage PiN diode has a problem of high modulation which causes high switching losses and low switching speeds. The high modulation means high carrier injection and high stored charges. A large amount of carriers (e.g. P type charges) are injected from the topside P layer 1 into the N-type epitaxial layer 2, where they become stored charges. There is also charge injection from the heavily doped N type substrate 4 into the N type buffer region 3 and the lightly doped N type layer 2. This improves the forward conductivity of the diode, but leads to high switching losses and slow switching speed because those stored charges need to removed from the lightly doped layer 2 when the diode turns off.

In order to overcome this high modulation and slow switching of the PiN diode for high frequency applications, the topside P surface doping concentration is reduced as shown in FIG. 1B. The PiN diode of FIG. 1B has the same layer structures as FIG. 1A except that the topside P layer 1' of FIG. 1B has a lower dopant concentration, e.g., $1E16/cm^3$, in contrast to a dopant concentration of $1E17/cm^3$ for topside P layer 1 of FIG. 1A. However, the lowering of topside P doping concentration is limited by punch through constraints. There needs to be enough P charge present to bring the electric field down to zero or else the device will punch through and leak heavily. Due to the punch through design consideration, the lowest surface P charge that is practical may be about $Qp=2E12/cm^2$. FIG. 1C shows another step to improve the device performance by lowering the N charge injection from the bottom side by back grinding away the N+ substrate 4 on the bottom side followed by carrying out a backside heavily doped N-type implant and anneal to form thin heavily doped N type back region 5 for making a good ohmic contact to the back side of the diode. Due to the ohmic contact constraint, the reduction of the N charge carriers in N type back region 5 has a lower limit of about $Qn=5E12/cm^2$. Thus despite these steps, there are still limitations in the improvement of the device switching speed.

For all these reasons, there are great and urgent demands to improve the configurations and method of manufacturing the PiN diodes with improved control of charge injection and softness operation such that the above-discussed technical limitations and difficulties can be resolved.

SUMMARY OF THE PRESENT INVENTION

It is therefore an aspect of the present invention to provide a new and improved device configuration of PiN diodes with an added buffer region to lower the injection efficiency to lower minority charges in the drift region and to tailor its profile to achieve soft switching. In addition, the device requires minimal or no conventional lifetime control techniques, which makes its characteristics stable at high temperature.

Specifically, it is an aspect of the present invention to provide improved device configuration for manufacturing a PiN diode with improved control of the top side injection efficiency and to further improve the carrier profile and forward conduction voltage drop, Vf. Different top side configurations are disclosed in this invention for the PiN diodes including configuration of trench gates to reduce the topside injection areas and additional buffer regions for improved break down voltage control.

It is another aspect of the present invention to provide improved device configuration for manufacturing a PiN diode with backside grinding and annealed dopant layer that is patterned for backside charge injection control. Additionally, Schottky contacts may be formed to topside body regions between trench gates to improve the device performance by reducing the forward bias voltage drop Vf.

Briefly in a preferred embodiment this invention discloses a semiconductor device disposed in a semiconductor substrate. By way of example, the semiconductor substrate may include a bottom (typically heavily doped) layer and an upper epitaxial layer. The semiconductor device includes a first semiconductor layer of a first conductivity type located below a second semiconductor layer of a second conductivity type. The second semiconductor layer is located at a top portion of the semiconductor substrate, as part of the semiconductor substrate. The first semiconductor layer includes an injection efficiency controlling buffer layer located in a top portion of the first semiconductor layer and disposed immediately below the second semiconductor layer. The first semiconductor layer also includes a drift region of the first conductivity type located below the injection efficiency controlling buffer layer, wherein the injection efficiency controlling buffer layer is more heavily doped than the drift layer such that the injection efficiency of the second semiconductor layer is controlled. The first and second semiconductor layers comprise two parts of a diode, one part being an anode and the other part being a cathode.

In another embodiment, the first semiconductor layer further includes a bottom heavily doped region of the first conductivity type located at the bottom of the semiconductor substrate. It may also further include a soft recovery buffer layer of the first conductivity type disposed above the bottom heavily doped region and below the drift region with the soft recovery buffer layer having a lower doping concentration than the bottom heavily doped region and a higher doping concentration than the drift region.

In another embodiment, the semiconductor device further includes a trench gate opened in the semiconductor substrate extending into the injection efficiency controlling buffer layer. The trench gate may further include a gate electrode biased such that it charge compensates the injection efficiency controlling buffer layer. In one embodiment, the trench gate further includes a gate electrode electrically connected to the second semiconductor layer. In another embodiment, a top metal layer is located over and electrically connected to the trench gate and to the second semiconductor layer. In another embodiment, a bottom metal layer is located on the bottom of the first semiconductor layer.

In another embodiment, the semiconductor device further includes a breakdown voltage enhancement doped region of a second conductivity type located between adjacent portions of the second semiconductor layer, in which the breakdown voltage enhancement doped region is electrically floating. In another embodiment, a plurality of breakdown voltage enhancement doped regions of a second conductivity type are located between adjacent portions of the second semiconductor layer in which the plurality of the plurality of breakdown voltage enhancement doped regions are electrically floating.

In another embodiment, the semiconductor device further includes a plurality of the trench gates located between adjacent portions of the second semiconductor layer. In one embodiment, the semiconductor device further includes floating regions of the second conductivity type located between adjacent trench gates within the plurality of trench gates, the floating regions being electrically floating. In another embodiment, the semiconductor device further includes a metal layer disposed on top of the semiconductor substrate electrically connected to the second semiconductor layer and the trench gates; the device also includes lightly doped regions located between adjacent trench gates within the plurality of trench gates such that contact between the metal layer and the lightly doped regions form a Schottky contact.

In another embodiment, the first semiconductor layer further includes a heavily doped region of the first conductivity type at the bottom of the first semiconductor layer, the heavily doped region being disposed on a partial area on the bottom surface of the semiconductor substrate, leaving another area on the bottom surface that does not contain the heavily doped region.

In another embodiment, the first conductivity type of the semiconductor device is N-type and the second conductivity type is P-type. In another embodiment the first conductivity type of the semiconductor device is P-type and the second conductivity type is N-type.

In another embodiment, the first semiconductor layer and the second semiconductor layer form a vertical diode, in which the semiconductor substrate further includes an insulated gate bipolar transistor (IGBT) such that the diode is integrated with the IGBT.

This invention further discloses a method for manufacturing a semiconductor device disposed in a semiconductor substrate. The method comprises steps of forming a first semiconductor layer of a first conductivity type in the semiconductor substrate and forming a second semiconductor layer of a second conductivity type at a top portion of the semiconductor substrate, over the first semiconductor layer. In an embodiment, the step of forming a first semiconductor layer further includes forming an injection efficiency controlling buffer layer of the first conductivity type immediately below the second semiconductor layer of the second conductivity type and forming a drift layer of the first conductivity type below the injection efficiency controlling buffer layer such that the injection efficiency controlling buffer layer is more heavily doped than the drift region to control an injection efficiency of the second semiconductor layer. The first semiconductor layer and the second semiconductor layer comprise two parts of a diode, with one part being an anode and the other part being a cathode.

In another embodiment, the method further includes a step forming a trench gate extending into the injection efficiency controlling buffer layer to charge compensate the injection efficiency controlling buffer layer. The method may further include a step of electrically connecting a gate electrode of the trench gate to the second semiconductor layer.

In another embodiment, the method may further include a step of forming a breakdown voltage enhancement doped region of the second conductivity type between adjacent portions of the second semiconductor layer to increase a breakdown voltage and to control the injection, in which the breakdown voltage enhancement doped region is electrically floating. In another embodiment, the method further includes a step of forming a plurality of breakdown voltage enhancement doped regions of the second conductivity type between adjacent portions of the second semiconductor layer to increase a breakdown voltage and to control the injection, in which the plurality of breakdown voltage enhancement doped regions are electrically floating.

In another embodiment, the method further includes a step of forming a plurality of the trench gates extending into the injection efficiency controlling buffer layer between adjacent portions of the second semiconductor layer. The method may further include a step of forming floating regions of second conductivity type between adjacent gate trenches within the plurality of gate trenches, in which the floating regions are formed at the same time as the second semiconductor layer. Alternatively, the method may further include: a step of forming a metal layer on top of the semiconductor substrate, the metal layer electrically connected to the second semiconductor layer and to the trench gates; and a step of forming lightly doped regions between adjacent gate trenches within the plurality of gate trenches such that the lightly doped regions form Schottky contact with the metal layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2 is a cross sectional view of a PiN diode device of this invention with added heavily doped N buffer region underneath the top anode layer.

FIGS. 3 and 3-1 are cross sectional views of a PiN diode device of this invention with added heavily doped N buffer region underneath the top anode layer and a trench gate to reduce the topside injection areas and prevent breakdown voltage lowering otherwise caused by the presence of the heavily doped N buffer under the blocking junction FIGS. 4 and 4-1 are cross sectional views of a PiN diode device of this invention with added heavily doped N buffer region underneath the top anode layer and a trench gate to reduce the topside injection area and further with P-region laterally opposite to the N buffer region to improve the breakdown voltage.

FIG. 5 is a cross sectional view of a PiN diode device of this invention with added heavily doped N buffer region underneath the top anode layer and a trench gate to reduce the topside injection areas and further with multiple P-regions laterally opposite from the N buffer region to improve the breakdown voltage.

FIG. 6 is a cross sectional view of a PiN diode device of this invention with added heavily doped N buffer region underneath the top anode layer and a plurality of trench gates to reduce the topside injection areas.

FIG. 7 is a cross sectional view of a PiN diode device of this invention with added heavily doped N buffer region underneath the top anode layer and a plurality of trench gates to reduce the topside injection areas and further having Schottky contact to body regions between the trench gates to improve the forward bias voltage drop Vf.

FIG. 8 is a cross sectional view of a PiN diode device of this invention with a similar structure as FIG. 7 and a patterned backside N-region to control the backside injection efficiency.

FIG. 9 is a cross sectional view of a PiN diode device of this invention integrated with an insulated gate bipolar transistor (IGBT) on a single die.

DETAILED DESCRIPTION OF THE METHOD

Figure 1A:
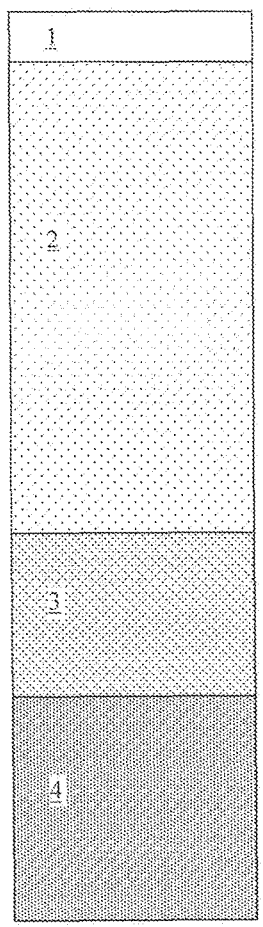
FIGS. 1A to 1C are cross sectional views for showing the layer structure of conventional PiN diodes.

Referring to FIG. 2 for a cross sectional view of a PiN diode 100 of this invention. The PiN diode 100 has a heavily doped N type bottom layer 105. By way of example, the PiN diode 100 may initially be supported on a thick N-type bottom substrate layer with a backside grinding process carried out to remove a bottom portion or all of the bottom substrate layer followed by a backside implanting and anneal process to form a thin layer of heavily doped N-doped bottom layer 105. Typical charge concentration in this region may be about $5E12/cm^2$. The bottom heavily N doped layer 105 supports a less heavily doped N buffer layer 110 for soft recovery with typical doping and thickness of about $5E14/cm^3$ and 15 um respectively. Above that N buffer layer 110 is the lightly doped N layer 115 (e.g. an epitaxial layer) with typical doping in the range of $2E13$-$1E14/cm^3$ and thickness of 30-90 um, depending on the breakdown voltage. The PiN diode 100 further includes a heavily doped N-type buffer layer 120 formed under a top P layer 125 and over the lightly doped N-type layer 115. The heavily doped N-type buffer layer 120 may serve as an injection efficiency controlling buffer layer. The additional heavily doped N buffer layer 120 significantly reduces the injection efficiency of the P anode layer 125 by reducing the minority carrier lifetime. Holes that are injected into the additional N buffer layer 120 will quickly recombine in the N buffer layer 120. A lower modulation near the blocking junction also creates a more soft recovery which is desirable for the device. The injection efficiency does not increase with temperature. The lower peak reverse current, IRM lowers current through the high voltage switch (MOSFET/IGBT) in inverter/power factor correction (PFC) circuits, thereby reducing the turn on losses and increasing efficiency. Faster switching speeds and less stored charge Qrr are made possible with the buffer layer 120, thus improving the efficiency of the diode and its applications.

However, putting a heavily doped N-type region (i.e. N buffer 120) by itself under the P layer 125 will have the negative effect of greatly reducing the blocking breakdown voltage. The more heavily doped the buffer layer 120 is, the worse the breakdown voltage of the diode becomes.

FIG. 3 shows a cross sectional view of another PiN diode 100-1 as an alternate embodiment of this invention. The PiN diode 100-1 has a similar layer structure as that shown in FIG. 2 with a thin bottom heavily doped bottom layer 105 supporting an N-buffer layer 110, a lightly doped N layer 115 (e.g., an epitaxial layer), and an additional N buffer layer 120 formed under the top P anode layer 125. The PiN diode 100-1 further includes a metal oxide semiconductor (MOS) type trench gate 130 formed near the top surface. The trench gate 130 may extend down to about the depth of the bottom of the additional N buffer layer 120. The presence of the trench gate 130 limits the area covered by the P type layer 125, thus limiting the P injection area and the amount of P injection. By way of example, trench gate 130 may be lined with a gate dielectric and filled with gate electrode such as a polysilicon layer. The gate electrode of gate trench 130 may be connected the anode, thus at the same potential as the top P region 125. In addition to limiting the P injection area of the top anode layer 125, the trench gate 130 further charge compensates the heavily doped N buffer layer 120, which improves the breakdown voltage of the device. The charge compensation by the trench gate 130 allows for the N buffer layer 120 to have a high doping concentration without adverse effects to the device breakdown voltage. By way of example, the trench gate 130 can easily charge compensate an N buffer layer 120 that has a dopant concentration of 1E15 to 1E17, e.g., $1E16/cm^3$.

Figure 1B:
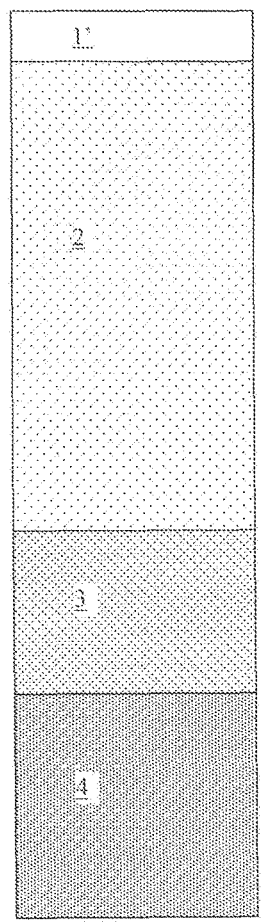
Figure 1C:
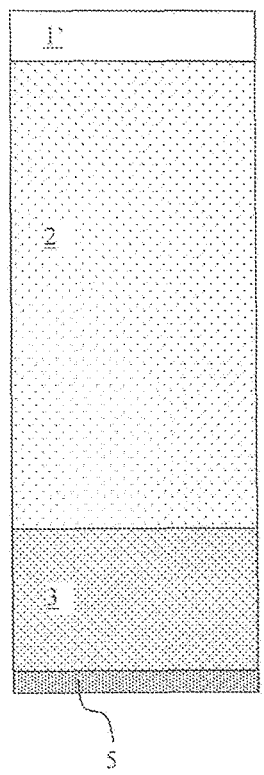

FIG. 3 is a cross sectional view showing half of a single cell of the device. FIG. 3-1 is a cross sectional view showing several cells of the device, in which the structure of FIG. 3 is mirrored and repeated.

FIG. 4 shows a cross sectional view of another PiN diode 100-2 as an alternate embodiment of this invention. The PiN diode 100-2 has a similar layer structure as that shown in FIG. 3 with a bottom heavily doped bottom layer 105 supporting an N-buffer layer 110, a lightly doped N layer 115, and an additional N buffer layer 120 formed under the top P anode layer 125. In addition to a trench gate 130 filled with a polysilicon layer formed near the top surface for limiting the P injection area, the PiN diode 100-2 further includes a lightly doped P-region 140 formed near the top surface extended to a depth into the top portion of the epitaxial layer 115. The lightly doped P-region 140 is separated from the N buffer region 120 and top P region 125 by trench gate 130. The lightly doped P-region 140 may be left floating and so is not connected to the anode of the diode and does not inject carriers into the lightly doped N layer 115. The P-region may completely deplete since it is lightly doped. In a preferred embodiment, the P-region 140 may be deeper than and slightly overlap with the gate trenches 130 to reduce field crowding, but it can also be formed less deep than the gate trenches if desired. The top metal layer 150 (e.g. anode metal) contacts the top P region 125 (e.g. anode region), and the gate electrode 130. An insulating layer 145 may insulate the P-region 140 from the anode metal 150. A cathode metal (not shown) may be formed on the bottom of the device, e.g., contacting heavily doped N-type region 105. The P-region 140 is formed to further reduce the area of P Anode region 125 on the surface that injects minority carriers, without compromising on the device breakdown voltage. The presence of this P-region 140 also lowers the anode-cathode coupling capacitance, which lowers the displacement currents through this device, and reduces electric field crowding to further improve breakdown voltage. While FIG. 4 shows half of a cell of PiN diode 100-2, FIG. 4-1 shows multiple cells of PiN diode 100-2. The amount of injection from top P region 125 is greatly limited by the presence of the floating P-regions 140.

FIG. 5 shows a cross sectional view of another PiN diode 100-3 as an alternate embodiment of this invention. The PiN diode 100-3 has a similar layer structure as that shown in FIGS. 3 and 4 with a thin bottom heavily doped bottom layer 105 supporting an N-buffer layer 110, a lightly doped N layer 115, an additional N buffer layer 120 formed under the top P anode layer 125. In addition to a trench gate 130 filled with a polysilicon layer formed near the top surface for limiting the P injection area, the PiN diode 100-3 further includes multiple P-regions 140-1, 140-2, and 140-3 formed near the top surface extended to a depth into the top portion of the epitaxial layer 115. By way of example, the multiple P-regions 140-1, 140-2, and 140-3 may have a higher doping concentration than the lightly doped P-region 140 of FIG. 5, to act like floating guard rings. Though shown to have a depth less than the gate trenches 130, the P-type regions may also extend deeper than the gate trenches. Multiple P-type regions 140-1, 140-2, and 140-3 are not connected to the anode and may be left floating. Between adjacent P-type regions 140-1, 140-2, 140-3, the lightly doped N layer 115 may extend to the top surface of the semiconductor substrate. The P-type regions 140-1, 140-2, and 140-3 are disposed on the other side of the gate trench 130 from anode regions 125 and N buffer region 120. The P-regions 140-1, 140-2 and 140-3 are formed to further reduce the area of P-type anode region 125 on the surface that injects minority carriers, without compromising on the device breakdown voltage. The presence of these P-type regions also lowers the anode-cathode coupling capacitance, which lowers the displacement currents through this device and helps spread the electric field to improve breakdown voltage.

FIG. 6 shows a cross sectional view of another PiN diode 100-4 as an alternate embodiment of this invention. The PiN diode 100-4 has a similar layer structure as that shown in FIGS. 3 and 4 with a bottom heavily doped bottom layer 105 supporting an N-buffer layer 110, a lightly doped N layer 115, an additional N buffer layer 120 formed under the top P anode layer 125. The PiN diode 100-4 further includes a plurality of trench gates 130-1, 130-2, . . . , 130-5 filled with a polysilicon layer formed near the top surface for limiting the P injection area. The top P-type layers between the trench gate, i.e., regions 126-1, 126-2, . . . 126-4 constitute floating body regions, as opposed to the anode regions 125 which are connected to the anode contact 150. The trench gates 130-1 to 130-5 are electrically connected to the anode contact 150 placed on top of and contacting the top anode layer 125. This configuration is similar to the PiN diode 100-3 of FIG. 5, but can be formed using the same processing steps (i.e., requires no extra processing steps or masks) as are needed to form the PiN diode 100-1 of FIG. 3 and FIG. 3-1. For example, P regions 126-1 to 126-4 can be formed in the same processing steps as forming the topside P region 125. The only difference in this structure is that some of the P anode mesas are not contacted to the topside metal that forms the anode terminal. Implementation of this structure only requires a change in the contact mask, while the process flow remains unchanged.

FIG. 7 shows a cross sectional view of another PiN diode 100-5 as an alternate embodiment of this invention. The PiN diode 100-5 has a similar layer structure as that shown in FIG. 6 with a thin heavily doped bottom layer 105 supporting an N-buffer layer 110, a lightly doped N layer 115, and an additional N buffer layer 120 formed under the top P anode layer 125. The PiN diode 100-5 further includes a plurality of trench gates 130-1 to 130-5 filled with a polysilicon layer formed near the top surface for limiting the P injection area. The top anode layer 125 does not extend through all the regions. Instead there is a top surface portion of the semiconductor substrate between trench gates 130-1, 130-2, . . . , 130-5 which are lightly doped regions 115-1, 115-2, 115-3 and 115-4, for forming Schottky diodes. The anode contact 150-1 can extend across the surface of the device, contacting anode region 125 and lightly doped regions 115-1 to 115-4 alike. Where the anode contact 150-1 contacts the lightly doped regions 115-1 to 115-4, Schottky contacts 160 are formed, lowering the diode forward bias voltage Vf. The trench gates 130-1 to 130-5 also provide shielding to maintain the breakdown voltage in the Schottky regions. The trench gates 130-1 to 130-5 may be connected to the anode contact 150-1. The introduction of Schottky contacts lowers topside injection efficiency and also provides path for current conduction via majority carrier.

FIG. 8 shows a cross sectional view of another PiN diode 100-6 as an alternate embodiment of this invention. The PiN diode 100-6 has a similar structure as that shown in FIG. 7; however, instead the thin heavily doped bottom N type layer 105-1 of PiN diode 100-6 is patterned when it is formed such that it only exists in certain areas. The patterned backside N regions 105-1 further improve the switching speed of the device, by reducing area covered by the bottom heavily doped N region 105-1 thus reducing the amount of carrier injection from the bottom heavily doped N region 105-1. However, portions of the bottom heavily doped N region 105-1 remain to allow good ohmic contact to a bottom metal 155 (e.g., for a cathode terminal). By way of example, the bottom heavily doped N region 105-1 may be patterned such that it is located approximately under the P type anode regions 125.

With the improvements shown in this invention, the N-type buffer layer 120 may having a high doping concentration, e.g. 1E15 to $1E17/cm^3$ while still retaining acceptable breakdown capabilities. In addition the injection efficiency of the diode has been greatly reduced to improve the efficiency and switching speed of the diode.

The diode of this invention could be formed as a discrete diode die and used or co-packaged with another device such as an insulated gate bipolar transistor (IGBT) or a metal oxide semiconductor field effect transistor (MOSFET). Alternatively, the diode could also be integrated on a single die with another device such as an IGBT or MOSFET.

FIG. 9 shows a cross sectional view of a PiN diode 190 integrated with a vertical IGBT device 195 on a single die 101 to form a reverse conducting IGBT as an alternate embodiment of this invention. The IGBT device 195 may be formed simultaneously with the PiN diode 190, which may have a similar structure as the PiN diode 100-5 shown in FIG. 7. The thin P+ collector region 106 at the bottom of the IGBT device 195 may be patterned before or after the N type backside layer 105 of the PiN diode 190 is formed such that both only exist in certain areas. The moderately doped N buffer layer 110, the lightly doped N-drift region 115, and the N-type injection efficiency controlling buffer layer 120 are formed using the same processing steps as those articulated in FIGS. 6-8. A heavily doped N-type layer 121 for the IGBT 195 may also be formed under the emitter/body region 137; heavily doped N-type layer 121 may be formed at the same time as N-type injection efficiency controlling layer 120 of the diode 190, or it may be formed separately, with its own doping concentration and depth. The same processing steps used to form the trench gates 130-1 to 130-3 of the PiN diode 190 may be used to form the shield electrode 135 of the IGBT device 195, which is connected to the anode/emitter metal 150-2; alternatively, the shield electrode 135 may be formed separately from trench gates 130-1 to 130-3. The anode/emitter metal 150-2 is also connected to the IGBT N-type source region 136, and the IGBT P-type emitter/body region 137. The IGBT 195 further includes a planar gate 138 in a dielectric 139 formed over the emitter/body region 137. The planar gate 138 can form an inversion channel at the top of the emitter/body region 137 which connects the source region 136 to an N-type region 116 located over heavily doped N-type region 121. By way of example, the N-type region 116 may be an extension of the heavily doped N-type region 121. A collector/cathode metal 155 at the bottom makes contact to both the P-type collector region 106 and the heavily doped N-type cathode contact region 105. By way of example, in an integrated die such as 101, the area taken by IGBT device 195 may be around 70% and the area taken by diode 190 may be around 30%; of course, the ratio may be different depending on the desired attributes of the device.

By sharing some processing steps, the PiN diode and IGBT integrated device has the advantage of increasing manufacturing efficiency and reducing cost. In addition, the semiconductor die 101 saves cost and space by integrating an IGBT device 195 with a high performance diode 190 on a single die to form a reverse conducting IGBT. The diode portion may have a structure like those revealed in the current patent application. The IGBT portion of the device may have a structure similar to those described in U.S. application Ser. No. 12/925,869 filed on Oct. 31, 2010 by Madhur Bobde et al, in the current patent application; alternatively, the IGBT may have different structure.

Although the paragraphs above have described a diode with the anode on top and the cathode on the bottom, this invention could reverse the two such that the cathode is on top and the anode is on the bottom by reversing the conductivity types of the semiconductor regions (i.e., from P-type to N-type and vice-versa).

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A semiconductor device disposed in a semiconductor substrate wherein:
   the semiconductor substrate includes a first semiconductor layer of a first conductivity type disposed below a second semiconductor layer of a second conductivity type;
   wherein said first semiconductor layer further comprises an injection efficiency controlling buffer layer of the first conductivity type immediately below said second semiconductor layer of the second conductivity type and a drift layer of the first conductivity type below the injection efficiency controlling buffer layer wherein the injection efficiency controlling buffer layer is more heavily doped than the drift region to control an injection efficiency of said second semiconductor layer, wherein the first semiconductor layer and the second semiconductor layer constituting a PiN (P-type/intrinsic/N-type) diode;
   a vertical IGBT (insulate-gate bipolar transistor) is integrated with the PiN diode on the semiconductor substrate beside the PiN diode to form a reverse conducting IGBT wherein the vertical IGBT is disposed laterally side-by-side adjacent to the PiN diode on the semiconductor substrate having a metal layer covering over a top surface to function as an anode for the PiN diode and an emitter for the IGBT respectively; and
   a doped region of a second-conductivity disposed below the first semiconductor layer to function as a collector electrode for the IGBT integrated with and disposed side-by-side adjacent to the PiN diode.

2. The semiconductor device according to claim 1, further comprising:
   a trench gate of the PiN diode extending from the metal layer into said injection efficiency controlling buffer layer to charge compensate the injection efficiency controlling buffer layer.

3. The semiconductor device according to claim 2, wherein:
   the trench gate further comprises a gate insulation layer surrounding the trench gate with a gate electrode filled in said trench gate and contacting the metal layer disposed on top of the trench gate.

4. The semiconductor device according to claim 2, wherein:
   the vertical IGBT further comprises a source region of the first conductivity type encompassed in the second semiconductor layer that constitutes an emitter/body region for the IGBT.

5. The semiconductor device according to claim 4, wherein:
   the IGBT further comprises a planar gate disposed on a top surface of the semiconductor substrate above the source region and the emitter/body region.

6. The semiconductor device according to claim 1, wherein:
   the IGBT further comprises a shield electrode disposed in a shield electrode trench surrounded by a trench insulation layer.

7. The semiconductor device according to claim 5 wherein:
　the IGBT further comprises an extension region of the first conductivity type extending vertically in the emitter/body region from the first semiconductor layer to the planar gate.

8. The semiconductor device according to claim 6, further comprising:
　a metal layer disposed on a bottom surface of said semiconductor substrate to electrically connected to the collector electrode of the IGBT and also to function as a cathode electrode for the PiN diode.

\* \* \* \* \*